(12) United States Patent
Yamamoto

(10) Patent No.: US 11,587,831 B2
(45) Date of Patent: Feb. 21, 2023

(54) METHOD FOR MACHINING WORKPIECE

(71) Applicant: DISCO CORPORATION, Tokyo (JP)

(72) Inventor: Naoko Yamamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 140 days.

(21) Appl. No.: 17/065,909

(22) Filed: Oct. 8, 2020

(65) Prior Publication Data

US 2021/0118735 A1 Apr. 22, 2021

(30) Foreign Application Priority Data

Oct. 16, 2019 (JP) .............................. JP2019-189674

(51) Int. Cl.
  *H01L 21/78* (2006.01)
  *H01L 21/02* (2006.01)
(52) U.S. Cl.
  CPC ........ *H01L 21/78* (2013.01); *H01L 21/02378* (2013.01)
(58) Field of Classification Search
  CPC ........................... H01L 21/78; H01L 21/02378
  See application file for complete search history.

(56) References Cited

U.S. PATENT DOCUMENTS

| 2010/0289040 A1* | 11/2010 | Seo | H01L 33/46 |
| | | | 257/E33.056 |
| 2016/0260630 A1* | 9/2016 | Morikazu | H01L 21/78 |
| 2019/0035684 A1 | 1/2019 | Nagaya et al. | |

FOREIGN PATENT DOCUMENTS

| JP | 2009105211 A | | 5/2009 |
| JP | 2016004831 A | * | 1/2016 |
| JP | 2018078162 A | | 5/2018 |
| JP | 2019102514 A | | 6/2019 |

OTHER PUBLICATIONS

Office Action issued in counterpart Singapore patent application No. 10202009269T, dated Oct. 6, 2021.

* cited by examiner

*Primary Examiner* — Mohammad M Choudhry
(74) *Attorney, Agent, or Firm* — Greer Burns & Crain Ltd.

(57) ABSTRACT

Provided is a method for machining a workpiece including a substrate that has front and back surfaces and a ductile material layer that contains a ductile material and is disposed on the front or back surface. The method includes a tape bonding step of bonding a tape on a side of the substrate of the workpiece, a holding step of holding the workpiece by a holding table via the tape, and a cutting step of relatively moving the holding table and a cutting blade to cause the cutting blade to cut into the ductile material layer and the substrate. In the cutting step, the cutting blade is rotated such that a portion of the cutting blade, the portion being located on a forward side in a moving direction of the cutting blade relative to the holding table, cuts into the workpiece from the ductile material layer toward the substrate.

16 Claims, 8 Drawing Sheets

METHOD FOR MACHINING WORKPIECE

BACKGROUND OF THE INVENTION

Field of the Invention

The present invention relates to a method for machining a workpiece including a substrate and a ductile material layer.

Description of the Related Art

In electronic equipment including mobile phones and personal computers, device chips with devices such as electronic circuits included therein are arranged as essential configuration elements. Such device chips are obtained by defining a wafer, which is formed, for example, of a semiconductor material such as silicon (Si), on a side of a front surface thereof into a plurality of regions along scheduled division lines (hereinafter called "streets"), forming devices in the individual regions, and then dividing the wafer along the streets.

In recent years, there are increasing cases to dispose a film formed of a metal such as copper (Cu) (hereinafter called a "metal film") on a back surface of a wafer for realization of various functions required for device chips. When dividing such a workpiece with a wafer and a metal film included therein, a tape, for example, is bonded to a side of the metal film of the workpiece to hold the workpiece on the side of the metal film (via the tape) such that the wafer is exposed. Subsequent cutting of the workpiece with a cutting blade, which is being rotated in such a direction as cutting into the workpiece from a side of the wafer to the side of the metal film, makes it possible to cut and divide the workpiece into a plurality of device chips.

With the above-mentioned method, however, the metal film formed of such a ductile metal is stretched toward the tape by the rotating cutting blade, so that rough metal edges called "burrs" tend to occur from the metal film. Such burrs act as a cause of occurrence of a failure such as short-circuiting between terminals, for example, when mounting such a device chip on a printed circuit board, and hence there is a need to fully suppress the occurrence of burrs when dividing a workpiece that includes a metal film.

To resolve such a problem, a method has been proposed to cut a metal film by irradiating a laser beam (see, for example, JP 2018-78162 A). According to this method, after a workpiece is cut from a side of a wafer under conditions that a cutting blade would not cut into the metal film, the laser beam is irradiated to cut the metal film. As no cutting blade is used in the cutting of the metal film, the metal film remains free of burrs that would otherwise occur through contact with a rotating cutting blade.

SUMMARY OF THE INVENTION

With a method that cuts a metal film with a laser beam as mentioned above, however, a cutting apparatus and a laser processing apparatus have to be used in combination, leading to a problem that its equipment and steps tend to become complex. Complex equipment and steps in turn lead to an increase in cost required for the processing of the workpiece.

The present invention therefore has, as an object thereof, the provision of a method for machining a workpiece having a substrate such as a wafer and a ductile material layer such as a metal film, which can machine the workpiece through simple steps and can suppress the occurrence of burrs from the ductile material layer.

In accordance with an aspect of the present invention, there is provided a method for machining a workpiece including a substrate that has a front surface and a back surface and a ductile material layer that contains a ductile material having ductility and is disposed on the front surface or the back surface of the substrate. The method includes a tape bonding step of bonding a tape on a side of the substrate of the workpiece, a holding step of holding the workpiece by a holding table via the tape such that the ductile material layer is exposed, and a cutting step of, after performing the holding step, relatively moving the holding table and a cutting blade to cause the cutting blade to cut into the ductile material layer and the substrate, so that the workpiece is cut. In the cutting step, the cutting blade is rotated such that a portion of the cutting blade, the portion being located on a forward side in a moving direction of the cutting blade relative to the holding table, cuts into the workpiece from the ductile material layer toward the substrate.

Preferably, the ductile material layer may be disposed on the back surface of the substrate, the workpiece may further include a plurality of devices disposed on a side of the front surface, and the ductile material layer may be formed from a metal film.

Preferably, the method may further includes, after performing the holding step but before performing the cutting step, a position detecting step in which a position where the cutting blade is to be caused to cut into the workpiece is detected based on an image acquired by imaging the front surface of the substrate through the holding table and the tape.

Preferably, the substrate may be formed from silicon carbide (SiC).

In the machining method according to the aspect of the present invention, the workpiece is held by the holding table via the tape such that the ductile material layer is exposed, and the cutting blade is then rotated such that a portion of the cutting blade, the portion being located on the forward side in the moving direction of the cutting blade relative to the holding table, cuts into the workpiece from the ductile material layer toward the substrate, so that the workpiece is cut.

Accordingly, even in a situation where the ductile material layer with the ductile material contained therein is brought into close contact with the cutting blade and is stretched, the cutting blade comes into contact with the substrate formed with a material harder than the ductile material, so that the ductile material held in close contact with the cutting blade is removed from the cutting blade and remains substantially unstretched. As a consequence, the occurrence of burrs from the ductile material layer can be suppressed.

Further, the machining method according to the aspect of the present invention does not need to use a cutting apparatus and a laser processing apparatus in combination unlike a case that the ductile material layer is cut by a laser beam, and therefore, the workpiece can be machined by simple steps. According to the machining method of the aspect of the present invention, the workpiece can be machined by the simple steps, and the occurrence of burrs from the ductile layer can be suppressed.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
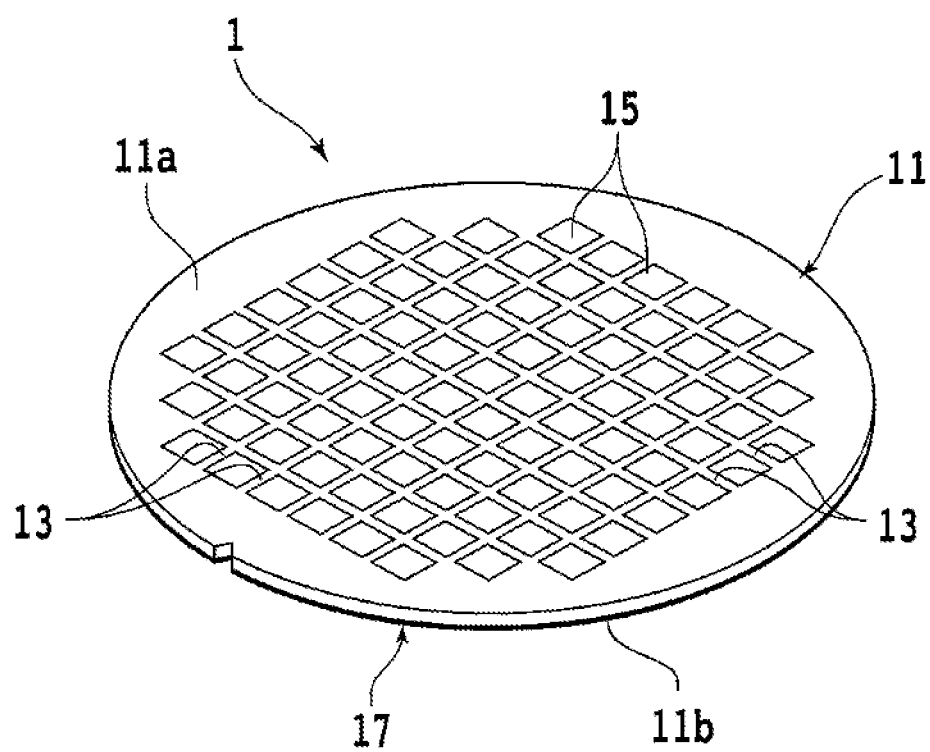
FIG. 1 is a perspective view depicting a workpiece.

With reference to the attached drawings, a description will be made about an embodiment of the present invention. FIG. 1 is a perspective view depicting a workpiece 1 to be machined by a machining method according to the embodiment. As depicted in FIG. 1, the workpiece 1 in the embodiment includes a substrate (wafer) 11 formed in a disc shape by using a semiconductor material such as SiC.

The substrate 11 is defined into a plurality of small regions by a plurality of mutually intersecting streets 13, and devices (power devices) 15 such as inverters or converters for use in control of electric power are formed in the individual small regions. The resulting pattern of the devices 15 is configured to be distinguishable, for example, from a side of a front surface 11a of the substrate 11.

On a side of a back surface 11b of the substrate 11, the back surface 11b being on a side opposite to the front surface 11a, a ductile material layer 17 containing a ductile material such as a metal is disposed. The ductile material layer 17 is a metal film formed to a thickness of approximately 0.1 to 30 µm, for example, with a metal such as gold (Au), silver (Ag), Cu, aluminum (Al), titanium (Ti) or nickel (Ni), and functions as a heat sink, a die attach adhesive (paste), or the like.

The ductile material layer 17 is also formed in regions that overlap the streets 13 as seen from a side of the front surface 11a or from a side of the back surface 11b of the substrate 11. The ductile material layer 17 may be a single-layer metal film formed with an alloy containing such a metal as mentioned above. As an alternative, the ductile material layer 17 may have a stacked structure in which a plurality of metal films, each being formed with a single kind of metal or metal alloy, is overlaid one over the other or another.

The workpiece 1 in the embodiment includes the disc-shaped substrate 11 formed with SiC or the like, and no significant limitation is imposed on the material, shape, structure, size, or the like of the substrate 11. Examples of the workpiece 1 may also include a substrate 11 formed with another semiconductor such as Si, gallium arsenide (GaAs), or gallium phosphide (GaP), or a material such as a ceramic or resin. As will be described subsequently herein, however, the substrate 11 needs to be formed with a material that is harder than the ductile material contained in the ductile material layer 17. Similarly, no limitations are imposed on the kind, number, shape, structure, size, arrangement, and the like of the devices 15 either. No devices 15 may be formed on the substrate 11.

Figure 2:
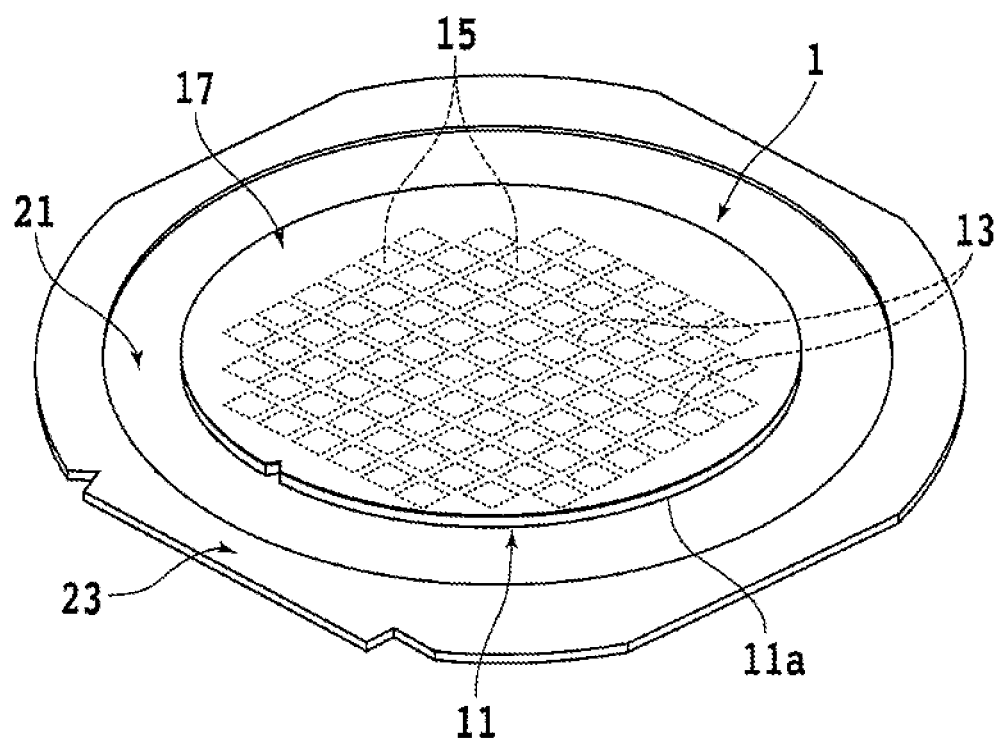
FIG. 2 is a perspective view depicting the workpiece with a tape bonded thereto.

In the machining method according to the embodiment, a tape 21 (see FIG. 2) which is greater than the workpiece 1 is first bonded to a side of the substrate 11 of the workpiece 1 (in other words, the side of the front surface 11a of the substrate 11, that is, a side opposite to the ductile material layer 17) (tape bonding step). FIG. 2 is a perspective view depicting the workpiece 1 with the tape 21 bonded thereon.

The tape 21 typically includes a film-shaped base material 21a (see FIG. 7, etc.) and a glue layer 21b disposed on one side of the base material 21a, and allows visible light to transmit therethrough. The base material 21a of the tape 21 is formed, for example, with a material such as a polyolefin, polyvinyl chloride, or polyethylene terephthalate, while the glue layer 21b of the tape 21 is formed, for example, with an acrylic or rubber-based material. If the tape 21 is brought on a side of the glue layer 21b thereof into close contact with the side of the front surface 11a of the substrate 11, the tape 21 is bonded to the workpiece 1.

On an outer peripheral portion on the side of the glue layer 21b of the tape 21, an annular frame 23 formed with a metal such as stainless steel or Al is fixed, for example. Therefore, the workpiece 1 is supported on the annular frame 23 via the tape 21. However, the workpiece 1 can also be machined without using the tape 21 and the frame 23.

As a further alternative, it is also possible to use a tape 21 that does not have the glue layer 21b. If this is the case, the tape 21 is bonded to the substrate 11 and the frame 23 by a method such as heat bonding that applies a pressure while heating. The use of the tape 21, which does not have the glue layer 21b, further facilitates below-described positional matching (hereinafter called "alignment") between a cutting blade 52 and the streets 13 of the workpiece 1. From this viewpoint of facilitating the alignment, it is desired to use a tape 21 including a planar base material 21a (for example, a base material 21a that has not been subjected to an embossing treatment).

Figure 3:
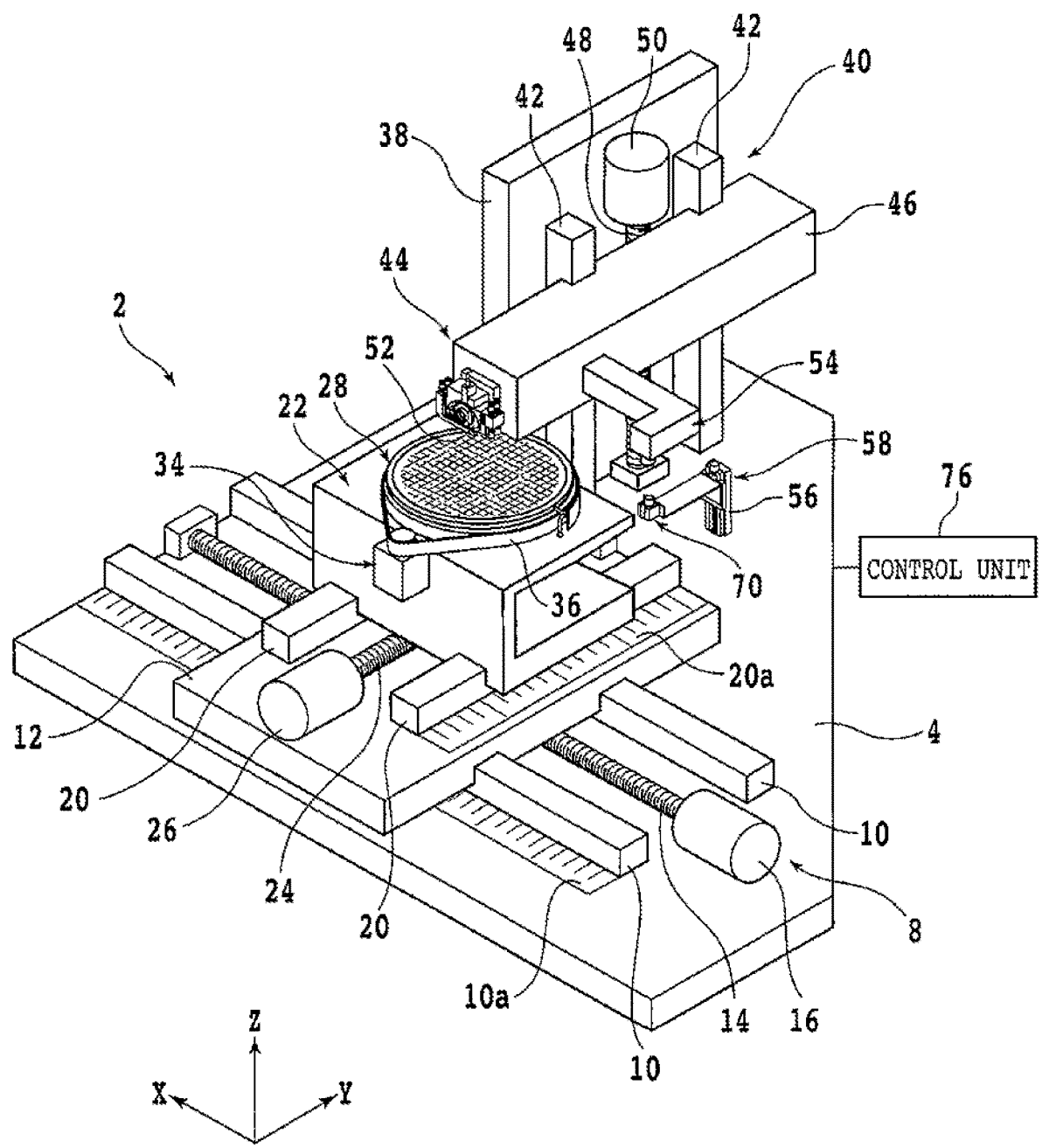
FIG. 3 is a perspective view depicting a cutting apparatus.

After the tape 21 has been bonded to the workpiece 1, the workpiece 1 is held on the side of the substrate 11 thereof via the tape 21 such that the ductile material layer 17 is exposed (holding step). FIG. 3 is a perspective view depicting a cutting apparatus 2 for use in the machining method according to the embodiment. In FIG. 3, a configuration element of the cutting apparatus 2 is indicated by a function block, and some configuration elements of the cutting apparatus 2 are omitted or simplified. In the following description, X-axis direction (machining feed direction), Y-axis direction (indexing feed direction), and Z-axis direction (height direction) are perpendicular to one another.

As depicted in FIG. 3, the cutting apparatus 2 includes a bed 4. On an upper surface of the bed 4, an X/Y moving mechanism (machining feed mechanism and indexing feed mechanism) 8 is arranged. The X/Y moving mechanism 8 includes a pair of X-axis guide rails 10, which is fixed on the upper surface of the bed 4 and is substantially parallel to the X-axis direction. On the X-axis guide rails 10, an X-axis moving table 12 is attached in a slidable fashion.

On a side of a lower surface of the X-axis moving table 12, nut portions (not depicted) are arranged. An X-axis ball screw 14, which is substantially parallel to the X-axis guide rails 10, is in threaded engagement with the nut portions. On an end of the X-axis ball screw 14, an X-axis pulse motor 16 is connected. Rotation of the X-axis ball screw 14 by the X-axis pulse motor 16 causes the X-axis moving table 12 to move in the X-axis direction along the X-axis guide rails 10.

Besides the X-axis guide rails 10, an X-axis scale 10a is arranged for use upon detection of a position of the X-axis moving table 12 in the X-axis direction.

Figure 4:
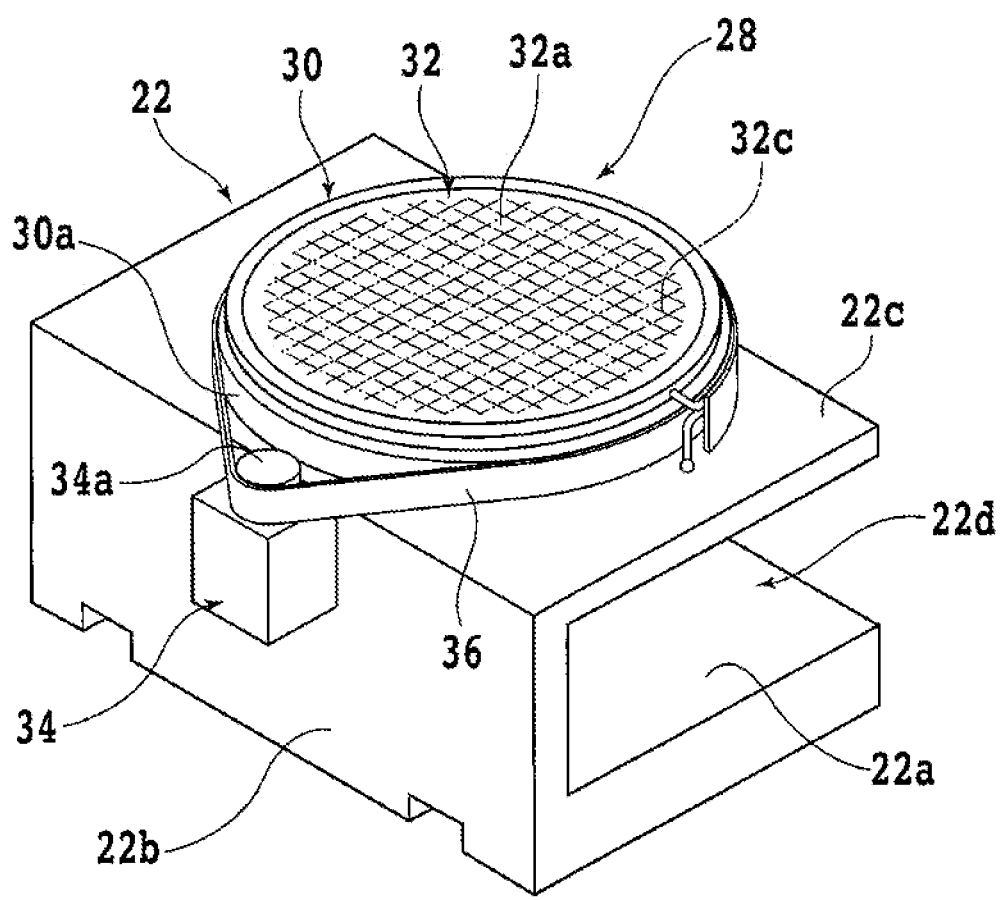
FIG. 4 is a perspective view depicting a section of the cutting apparatus.
Figure 4:
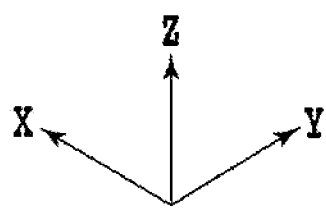
Figure 5:
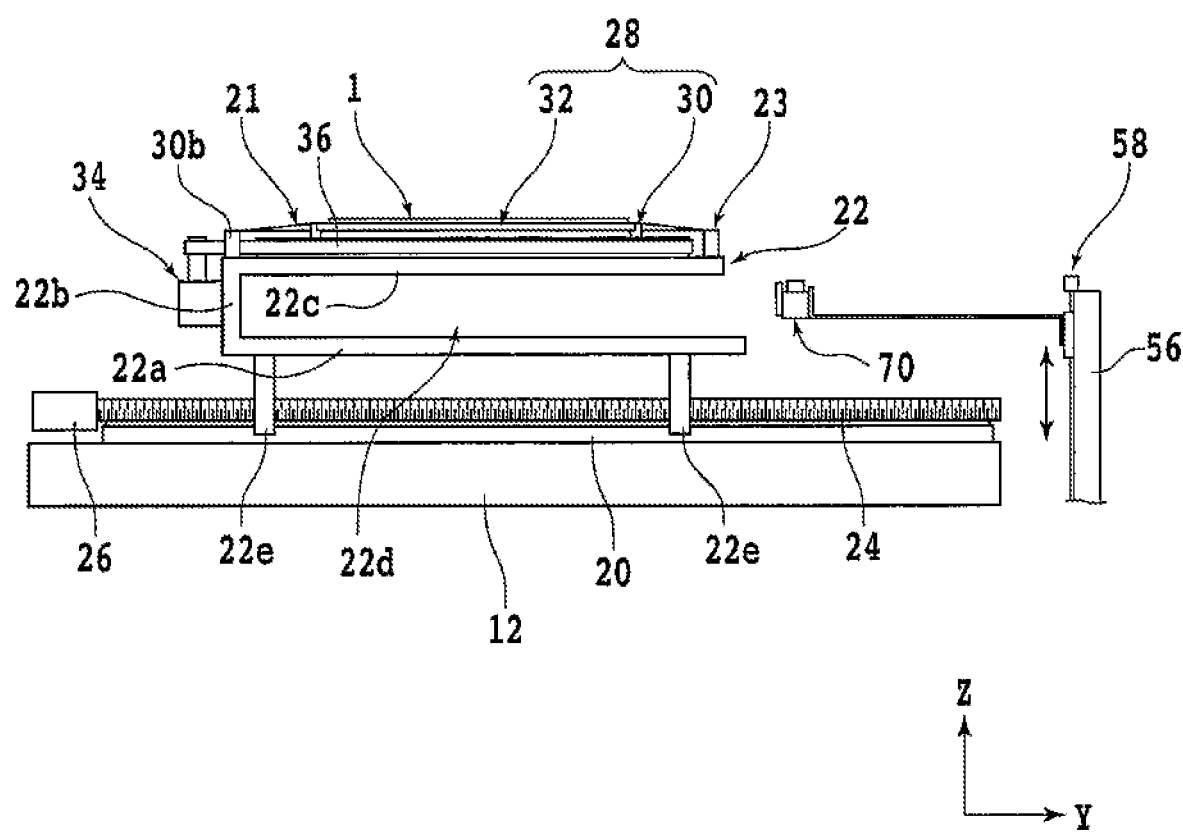
FIG. 5 is a cross-sectional view depicting another section of the cutting apparatus.

On an upper surface of the X-axis moving table 12, a pair of Y-axis guide rails 20 is arranged substantially in parallel to the Y-axis direction. To the Y-axis guide rails 20, a Y-axis moving table 22 is attached in a slidable fashion. FIG. 4 is a perspective view depicting a section of the cutting apparatus 2, the section including the Y-axis moving table 22, and FIG. 5 is a cross-sectional view depicting another section of the cutting apparatus 2, the section including the Y-axis moving table 22. In FIG. 5, hatching of cross-sections is omitted for the sake of convenience of a description.

As depicted in FIGS. 4 and 5, the Y-axis moving table 22 includes a bottom wall portion 22a, which has a rectangular shape as seen from the Z-axis direction. On an end of the bottom wall portion 22a in the Y-axis direction, a side wall portion 22b is connected at a lower end thereof. The side wall portion 22b has a rectangular shape as seen from the Y-axis redirection. To an upper end of the side wall portion 22b, a top wall portion 22c is connected at an end thereof in the Y-axis direction. The top wall portion 22c has a rectangular shape similar to that of the bottom wall portion 22a as seen from the Z-axis redirection. Between the bottom wall portion 22a and the top wall portion 22c, a space 22d is hence formed which is extending to an outside at the other ends of the bottom and top wall portions 22a, 22c in the Y-axis direction and also at opposite ends of the bottom and top wall portions 22a, 22c in the X-axis direction.

On a side of a lower surface of the bottom wall portion 22a of the Y-axis moving table 22, nut portions 22e (see FIG. 5) are arranged, and a Y-axis ball screw 24, which is substantially parallel to the Y-axis guide rails 20, is in threaded engagement with the nut portions 22e. On an end of the Y-axis ball screw 24, a Y-axis pulse motor 26 is connected.

Rotation of the Y-axis ball screw 24 by the Y-axis pulse motor 26 causes the Y-axis moving table 22 to move in the Y-axis direction along the Y-axis guide rails 20. Besides the Y-axis guide rails 20, a Y-axis scale 20a (see FIG. 3) is disposed for use upon detection of a position of the Y-axis moving table 22 in the Y-axis direction.

On a side of an upper surface of the top wall portion 22c of the Y-axis moving table 22, a holding table (chuck table) 28 is arranged for use upon holding the workpiece 1. The holding table 28 is supported on the top wall portion 22c in a fashion such that the holding table 28 can rotate about an axis of rotation which is substantially parallel to the Z-axis direction.

The holding table 28 includes a cylindrical frame member 30 formed, for example, using a metal represented by stainless steel. On an upper portion of the frame member 30, a disc-shaped holding member 32 is disposed to close an opening on a side of the upper portion of the frame member 30. The holding member 32 has a substantially planar upper surface 32a and a lower surface 32b (see FIG. 7, etc.) on a side opposite to the upper surface 32a, and is formed with a transparent material, such as soda glass, borosilicate glass, or quartz glass, that allows visible light to transmit therethrough.

As depicted in FIG. 4, in the upper surface 32a of the holding member 32, a plurality of grooves 32c is formed for use upon suction of the workpiece 1. A suction source (not depicted) including a vacuum ejector or the like is connected to the grooves 32c, so that a negative pressure generated at the suction source is allowed to act on the grooves 32c.

The holding member 32 is configured such that visible light is allowed to transmit through the holding member 32 at at least a region thereof other than the grooves 32c and the like and the workpiece 1 and the like disposed on a side of the upper surface 32a of the holding member 32 can be imaged from a side of the lower surface 32b of the holding member 32. In the embodiment, the holding member 32 formed in its entirety with the transparent material is described. It is, however, required for the holding member 32 to allow visible light to transmit through at least the portion thereof. In other words, the holding member 32 is not required to be formed with the transparent material alone.

On the side wall portion 22b of the Y-axis moving table 22, a rotary drive source 34 such as an electric motor is arranged. On a pulley portion 30a disposed on an outer periphery of the frame member 30 and a pulley 34a connected to a rotating shaft of the rotary drive source 34, a belt 36 is wrapped to transmit power of the rotary drive source 34. The holding table 28 is therefore rotated about the axis of rotation, which is substantially parallel to the Z-axis direction, by the power transmitted from the rotary drive source 34 via the belt 36.

On an outer peripheral portion of the frame member 30, a plurality of clamps 30b is arranged, in addition to the pulley portion 30a, for use when fixing the annular frame 23. The clamps 30b are fixed on the frame member 30 in a fashion such that they do not interfere with rotation of the holding table 28. The holding table 28 is also moved together with the X-axis moving table 12 and Y-axis moving table 22 in the X-axis direction and Y-axis direction by the above-mentioned X/Y moving mechanism 8.

As depicted in FIG. 3, a column-shaped or wall-shaped support structure 38 is disposed on the upper surface of the bed 4 in a region where the support structure 38 does not overlap the X/Y moving mechanism 8. On a side wall of the support structure 38, a Z-axis moving mechanism 40 is arranged. The Z-axis moving mechanism 40 includes a pair of Z-axis guide rails 42, which is fixed on the side wall of the support structure 38 and is substantially parallel to the Z-axis direction.

To the Z-axis guide rails 42, a spindle housing 46 which includes a cutting unit (machining unit) 44 is attached in a slidable fashion. On a side wall of the spindle housing 46, the side wall being on a side of the support structure 38, nut portions (not depicted) are disposed, and a Z-axis ball screw 48 is in threaded engagement with the nut portions. The Z-axis ball screw 48 is substantially parallel to the Z-axis guide rails 42.

To an end portion of the Z-axis ball screw 48, a Z-axis pulse motor 50 is connected. Rotation of the Z-axis ball screw 48 by the Z-axis pulse motor 50 causes the spindle housing 46 to move in the Z-axis direction along the Z-axis guide rails 42. Besides the Z-axis guide rails 42, a Z-axis scale (not depicted) is disposed for use upon detection of a position of the spindle housing 46 in the Z-axis direction.

The cutting unit 44 includes a spindle (not depicted) as a rotating shaft parallel to the Y-axis direction. The spindle is supported in a state that it can be rotated by the above-mentioned spindle housing 46. A distal end portion of the spindle is exposed from the spindle housing 46. On the distal end portion of the spindle, the cutting blade 52 with abrasive grains such as diamond fixed thereon by a binder such as a metal is fitted. To a side of a proximal end of the spindle, on the other hand, a rotary drive source (not depicted) such as an electric motor is connected.

On the spindle housing 46 of the cutting unit 44, an upper imaging unit 54 is fixed to image the workpiece 1 and the like, which are held by the holding table 28, from above. The upper imaging unit 54 is therefore moved together with the cutting unit 44 in the Z-axis direction by the Z-axis moving mechanism 40.

Figure 6:
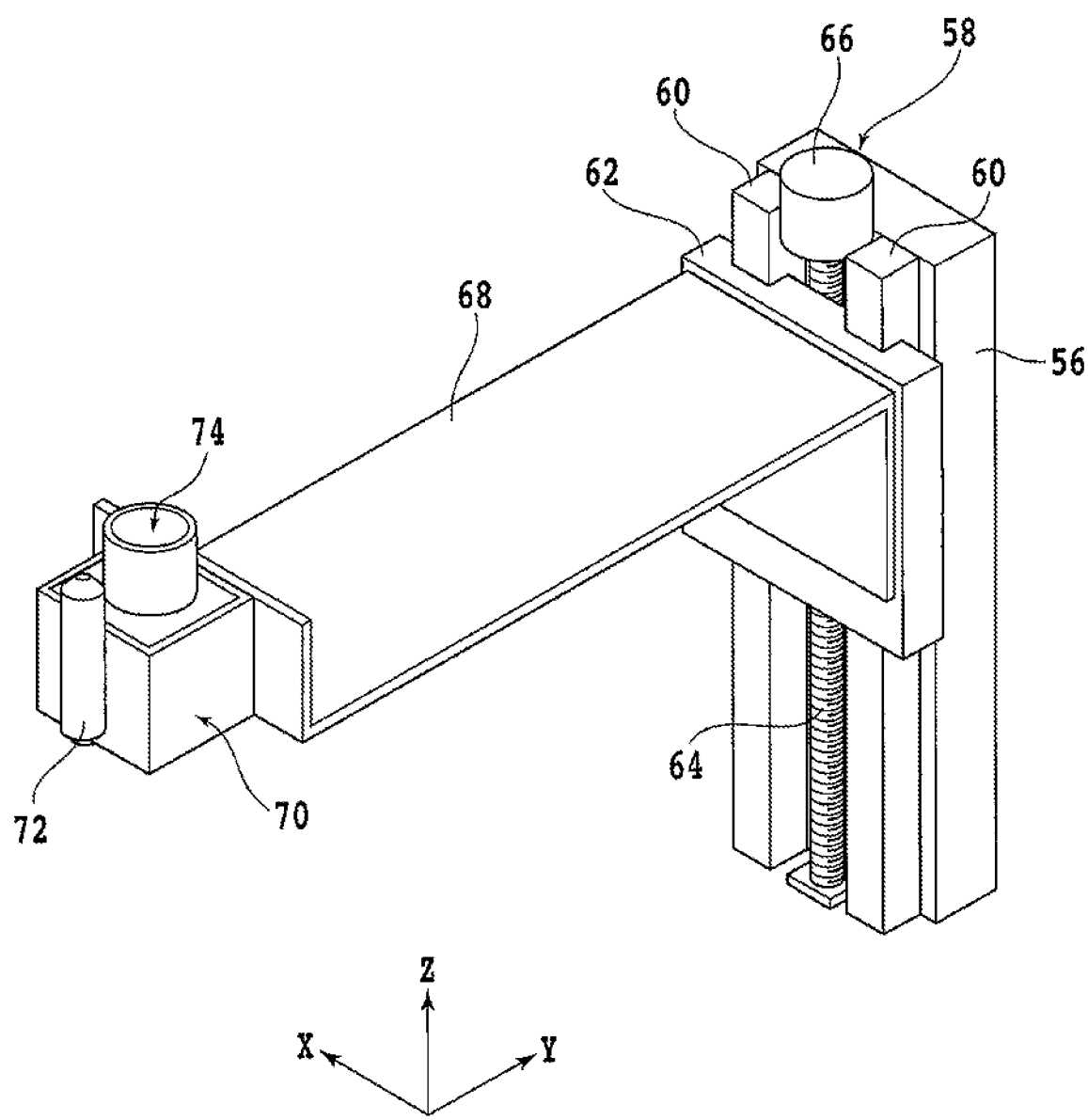
FIG. 6 is a perspective view depicting a further section of the cutting apparatus.

In a region on the upper surface of the bed 4, the region being remote in the Y-axis direction from the X/Y moving mechanism 8, a pillar-shaped or panel-shaped imaging unit support structure 56 is disposed. FIG. 6 is a perspective view depicting a further section of the cutting apparatus 2, the further section including the imaging unit support structure 56. On a side wall of the imaging unit support structure 56, an imaging unit moving mechanism 58 is arranged.

The imaging unit moving mechanism 58 includes a pair of Z-axis guide rails 60, which is fixed on the side wall of the imaging unit support structure 56 and is substantially parallel to the Z-axis direction. To the Z-axis guide rails 60, a Z-axis moving plate 62 is attached in a slidable fashion. Nut portions (not depicted) are arranged on the side wall of the Z-axis moving plate 62, the side wall being on a side of the imaging unit support structure 56, and a Z-axis ball screw 64 is in threaded engagement with the nut portions. The Z-axis ball screw 64 is substantially parallel to the Z-axis guide rails 60.

To an end portion of the Z-axis ball screw 64, a Z-axis pulse motor 66 is connected. Rotation of the Z-axis ball screw 64 by the Z-axis pulse motor 66 causes the Z-axis moving plate 62 to move in the Z-axis direction along the Z-axis guide rails 60. Besides the Z-axis guide rails 60, a Z-axis scale (not depicted) is disposed for use upon detection of a position of the Z-axis moving plate 62 in the Z-axis direction.

On the Z-axis moving plate 62, a lower imaging unit 70 is fixed via a support arm 68 elongated in the Y-axis direction. The lower imaging unit 70 includes an illumination apparatus 72 configured to irradiate visible light onto an upper object (the workpiece 1 in the embodiment) and a camera 74 having an imaging element to receive light reflected from the object and to form an image.

To configuration elements such as the X/Y moving mechanism 8, rotary drive source 34, Z-axis moving mechanism 40, cutting unit 44, upper imaging unit 54, imaging unit moving mechanism 58, and lower imaging unit 70, a control unit 76 is connected. The control unit 76 is configured, for example, by a computer including a processing apparatus such as a central processing unit (CPU) and a storage apparatus such as a flash memory, and controls operations of the individual configuration elements such that the workpiece 1 is adequately machined. Functions of the control unit 76 are realized by operating the processing apparatus according to software stored in the storage apparatus.

When holding the workpiece 1 on the side of the substrate 11, the tape 21 bonded to the side of the substrate 11 of the workpiece 1 is first brought into contact with the upper surface 32a of the holding member 32 of the holding table 28 as depicted in FIG. 5. A negative pressure generated at the suction source is then allowed to act on the grooves 32c. In addition, the frame 23 is fixed by the clamps 30b. As a consequence, the workpiece 1 is held on the holding table 28 with the side of the ductile material layer 17 being exposed upward.

Figure 7:
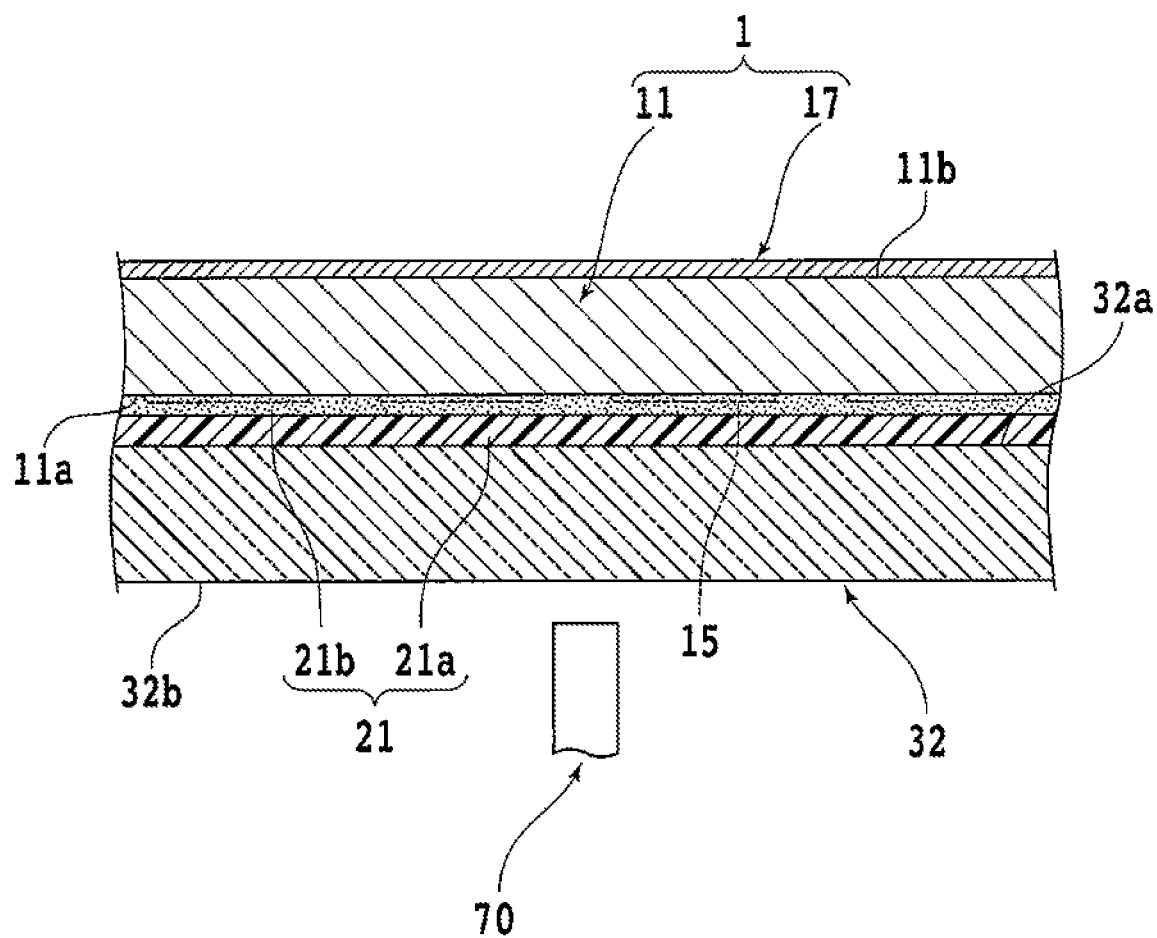
FIG. 7 is a fragmentary cross-sectional view illustrating how the workpiece is imaged from below.

After the workpiece 1 has been held on the side of the substrate 11 thereof by the holding table 28, desired one of the streets 13, in other words, a position where the cutting blade 52 is to be caused to cut into the workpiece 1 is detected based on an image acquired by imaging the workpiece 1 from below (position detecting step). FIG. 7 is a fragmentary cross-sectional view illustrating how the workpiece 1 is imaged from below.

Descried specifically, operations of the X/Y moving mechanism 8 and imaging unit moving mechanism 58 are controlled by the control unit 76 such that, as illustrated in FIG. 7, the lower imaging unit 70 is arranged below the region of the holding member 32 where visible light is allowed to transmit. Specifically, the lower imaging unit 70 is inserted into the space 22d between the bottom wall portion 22a and the top wall portion 22c of the Y-axis moving table 22. A positional relation between the holding member 32 and the lower imaging unit 70 is adjusted as desired within a range suited for imaging the workpiece 1.

As mentioned above, the portion of the holding member 32 and the tape 21 allow visible light to transmit therethrough. Therefore, the front surface 11a of the substrate 11 can be imaged to form an image if visible light is irradiated from the illumination apparatus 72 of the lower imaging unit 70 toward the workpiece 1 above the illumination apparatus 72 and light reflected by the lower surface of the workpiece 1 (the front surface 11a of the substrate 11) is received at the imaging element of the camera 74. As described above, the front surface 11a of the substrate 11 is imaged through the holding member 32 (holding table 28) and the tape 21 in the embodiment.

The image acquired by the camera 74 is sent, for example, to the control unit 76. The control unit 76 applies pattern matching, which extracts characteristic patterns or the like of the devices 15, to the image sent from the camera 74, and detects the position of the desired street 13 where the cutting blade 52 is to be caused to cut into the workpiece 1. The detected position of the desired street 13 is stored in the storage apparatus of the control unit 76.

Figure 8:
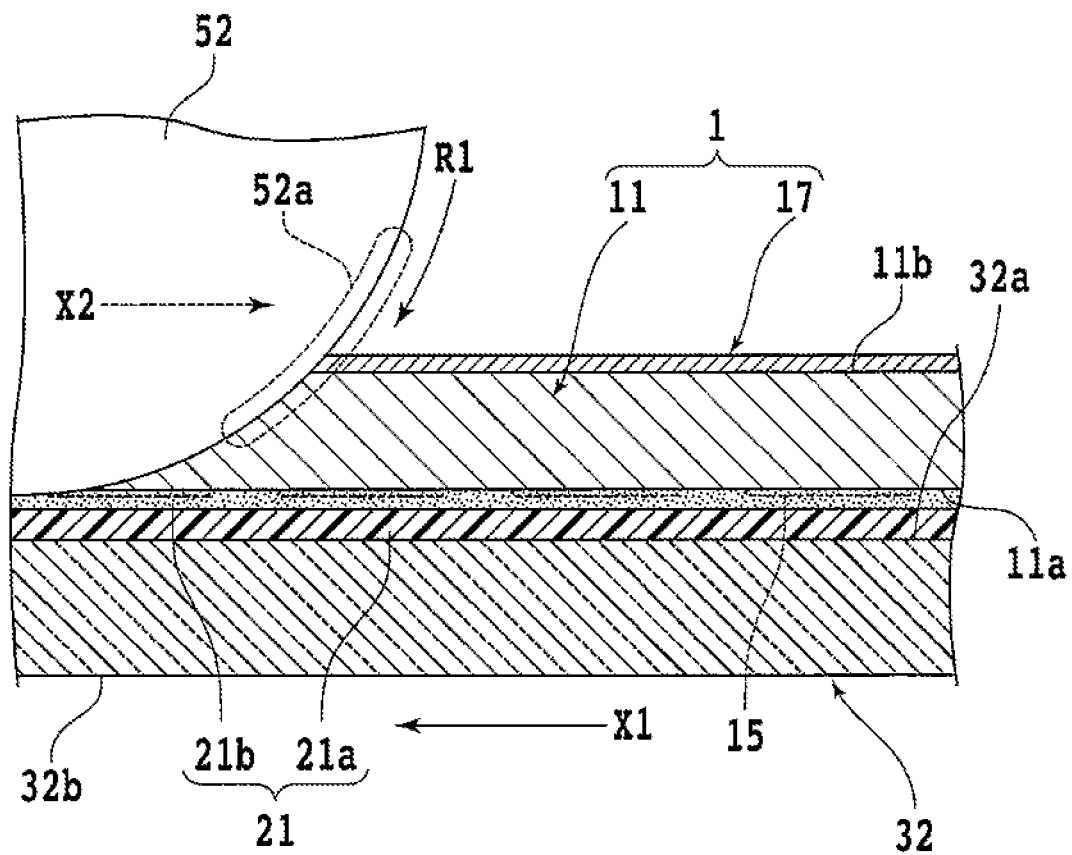
FIG. 8 is a fragmentary cross-sectional view illustrating how the workpiece is cut.

Subsequent to the detection of the position of the desired street 13, the rotating cutting blade 52 is caused to cut into the workpiece 1 to cut the workpiece 1 (cutting step). FIG. 8 is a fragmentary cross-sectional view illustrating how the workpiece 1 is cut. Described specifically, operation of the rotary drive source 34 is controlled, for example, by the control unit 76 such that the desired street 13 to be machined is brought into substantially parallel to the X-axis direction. In addition, operation of the X/Y moving mechanism 8 is controlled by the control unit 76 such that the position of the cutting blade 52 is aligned above an extension of the desired street 13 to be machined.

Operation of the Z-axis moving mechanism 40 is then controlled by the control unit 76 to adjust the position of the cutting unit 44 in the Z-axis direction such that the height of the lower extremity of the cutting blade 52 becomes lower than the height of the lower surface of the workpiece 1 (the front surface 11a of the substrate 11). Subsequently, as illustrated in FIG. 8, the holding table 28 is moved in the X-axis direction (a first direction X1) by the X/Y moving mechanism 8 while rotating the cutting blade 52. In other words, the holding table 28 and the cutting blade 52 are relatively moved in the X-axis direction.

Here, representing a direction in which the cutting blade 52 moves relative to the holding table 28 as a second direction X2 (a direction opposite to the first direction X1), a direction R1 in which the cutting blade 52 is rotated is set such that a portion 52a of the cutting blade 52, the portion 52a being located on a forward side in the second direction X2, cuts into the workpiece 1 from the ductile material layer 17 toward the substrate 11. In other words, the cutting blade 52 is rotated such that the portion 52a of the cutting blade 52 moves downwardly from above.

Even in such a situation that the ductile material layer 17 with the ductile material contained therein is brought into close contact with the cutting blade 52 and would hence be stretched by the cutting blade 52, the rotation of the cutting blade 52 in the direction R1 as described above brings the cutting blade 52 into contact with the substrate 11 formed with the material harder than the ductile material, so that the ductile material held in close contact with the cutting blade 52 is removed from the cutting blade 52 and remains substantially unstretched. Therefore, the occurrence of burrs from the ductile material layer 17 can be suppressed.

By the procedures described above, the cutting blade 52 is caused to cut into the workpiece 1 (the ductile material layer 17 and the substrate 11) along the desired street 13 to be machined. As a result, the workpiece 1 is cut along the desired street 13. These procedures are repeated until the workpiece 1 is cut along all the streets 13 set on the workpiece 1.

It has already been confirmed that, if the conditions to be described next are satisfied, the occurrence of burrs from the ductile material layer 17 can be suppressed at a particularly high level. Use of such a thin cutting blade 52 as satisfying these conditions also significantly contributes to the suppression of the occurrence of burrs in that the volume of the ductile material layer 17 to be removed by cutting is reduced.

Material of substrate: SiC
Thickness of substrate: 50 µm or greater but 360 µm or smaller
Material of ductile material layer: Au, Ag, Cu, Al, Ti, or Ni
Thickness of ductile material layer: 0.1 µm or greater but 30 µm or smaller
Intervals of streets: 0.5 mm or greater but 5 mm or smaller
Kind of cutting blade: electroformed blade
Thickness of cutting blade: 15 µm or greater but 40 µm or smaller
Grain size (grit) of abrasive grains contained in cutting blade: #1200 or greater but #2000 or smaller
Rotational speed of cutting blade (peripheral speed of cutting blade): 15,000 rpm or higher but 30,000 rpm or lower (2,600 m/min or higher but 5,300 m/min or lower)
Feed rate of holding table: 20 mm/s or higher but 100 mm/s or lower if a ductile material layer is formed on the C surface of SiC; 1 mm/s or higher but 10 mm/s or lower if a ductile material layer is formed on the Si surface of SiC As described above, in the machining method according to the embodiment, after the workpiece 1 has been held by the holding table 28 via the tape 21 such that the ductile material layer 17 is exposed, the cutting blade 52 is rotated such that the portion 52a of the cutting blade 52, the portion 52a being located on the forward side in the moving direction (the second direction X2) of the cutting blade 52 relative to the holding table 28, cuts into the workpiece 1 from the ductile material layer 17 toward the substrate 11. As a result, the workpiece 1 is cut.

Even in such a situation that the ductile material layer 17 with the ductile material contained therein is brought into close contact with the cutting blade 52 and would hence be stretched by the cutting blade 52, the cutting blade 52 comes into contact with the substrate 11 formed with the material harder than the ductile material, so that the ductile material held in close contact with the cutting blade 52 is removed from the cutting blade 52 and remains substantially unstretched. As a consequence, the occurrence of burrs from the ductile material layer 17 can be suppressed.

Also, in the machining method according to the embodiment, it is unnecessary to use a cutting apparatus and a laser processing apparatus in combination unlike a case that the ductile material layer 17 is cut by a laser beam, and therefore, the workpiece 1 can be machined by the simple steps. According to the machining method of the embodiment, the workpiece 1 can be machined by the simple steps, and the occurrence of burrs from the ductile material layer 17 can be suppressed.

It is to be noted that the present invention can be practiced with various changes without limitation to or by the description of the above-mentioned embodiment. For example, it has been confirmed that, when a workpiece including a substrate formed with Si is machined, satisfaction of the following conditions makes it possible to suppress the occurrence of burrs from a ductile material layer at a high level. Use of such a thin cutting blade as satisfying these conditions also significantly contributes to the suppression of the occurrence of burrs in that the volume of the ductile material layer to be removed by cutting is reduced.

Material of substrate: Si
Thickness of substrate: 10 µm or greater but 300 µm or smaller
Material of ductile material layer: Au, Ag, Cu, Al, Ti, or Ni
Thickness of ductile material layer: 0.1 µm or greater but 30 µm or smaller
Intervals of streets: 0.1 mm or greater but 5 mm or smaller
Kind of cutting blade: electroformed blade
Thickness of cutting blade: 5 µm or greater but 40 µm or smaller
Grain size (grit) of abrasive grains contained in cutting blade: #1500 or greater but #3500 or smaller
Rotational speed of cutting blade (peripheral speed of cutting blade): 15,000 rpm or higher but 60,000 rpm or lower (2,600 m/min or higher but 10,500 m/min or lower)
Feed rate of holding table: 30 mm/s or higher but 200 mm/s or lower In the embodiment mentioned above, the description is made about the example in which the workpiece 1 is cut by the cutting blade 52. However, the machining method according to the present invention can also be applied when half-cutting a workpiece by a cutting blade. If this is the case, it is only necessary to adjust the position of the cutting unit in the Z-axis direction such that the height of the lower extremity of the cutting blade becomes higher than the lower surface of the workpiece (the front surface of the substrate) and lower than the height of an interface between the substrate and the ductile material layer (the back surface of the substrate).

In the embodiment mentioned above, the description is also made about the example in which the workpiece 1 including the metal film as the ductile material layer 17 is machined. The ductile material layer included in the workpiece is, however, not required to be such a metal film insofar as it contains a ductile material having higher ductility than that of the material of the substrate. For example, the ductile material layer may be a resin film or the like formed using a resin. Further, the ductile material layer may be arranged on the side of the front surface of the substrate.

Besides, the structures, methods, and the like according to the above-mentioned embodiment and modifications can be practiced with changes as needed to such extent as not departing from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method for machining a workpiece including a substrate that has a front surface and a back surface and a ductile material layer that contains a ductile material having ductility and is disposed on the front surface or the back surface of the substrate, the method comprising:
   a tape bonding step of bonding a tape on a side of the substrate of the workpiece;
   a holding step of holding the workpiece by a holding table via the tape such that the ductile material layer is exposed; and
   a cutting step of, after performing the holding step, relatively moving the holding table and a cutting blade to cause the cutting blade to cut into the ductile material layer and the substrate, so that the workpiece is cut,
   wherein in the cutting step, the cutting blade is rotated such that a portion of the cutting blade, the portion being located on a forward side in a moving direction of the cutting blade relative to the holding table, cuts into the workpiece from the ductile material layer toward the substrate.

2. The method according to claim 1, wherein the substrate is formed from silicon carbide.

3. The method according to claim 1, wherein:
   the ductile material layer is disposed on the back surface of the substrate,
   the workpiece further includes a plurality of devices disposed on a side of the front surface, and
   the ductile material layer is formed from a metal film.

4. The method according to claim 3, wherein the substrate is formed from silicon carbide.

5. The method according to claim 3, further comprising:
   after performing the holding step but before performing the cutting step, a position detecting step in which a position where the cutting blade is to be caused to cut into the workpiece is detected based on an image acquired by imaging the front surface of the substrate through the holding table and the tape.

6. The method according to claim 5, wherein the substrate is formed from silicon carbide.

7. The method according to claim 1, wherein the ductile material layer comprises a metal film.

8. The method according to claim 7, wherein the metal film comprises Cu, Au, Ag, Al, Ti, Ni, or combinations thereof.

9. The method according to claim 7, wherein the metal film comprises more than one layer.

10. The method according to claim 7, wherein the substrate comprises Si, GaAs, GaP, ceramic, or resin.

11. The method according to claim 1 wherein the substrate is made of a material harder than the ductile material layer.

12. The method according to claim 3 wherein the metal film comprises Cu, Au, Ag, Al, Ti, Ni, or combinations thereof.

13. The method according to claim 3 wherein the metal film comprises more than one layer.

14. The method according to claim 3 wherein the substrate comprises Si, GaAs, GaP, ceramic, or resin.

15. The method according to claim 3 wherein the substrate is made of a material harder than the ductile material layer.

16. The method according to claim 1 wherein:
   in the cutting step, the cutting blade is rotated such that the portion of the cutting blade, the portion being located on a forward side in a moving direction of the cutting blade relative to the holding table, cuts into the workpiece from the exposed ductile material layer toward the substrate reducing the occurrence of burrs from the ductile material layer.

* * * * *